United States Patent [19]
Hopfer

[11] 4,288,763
[45] Sep. 8, 1981

[54] ANALOG PHASE SHIFTER

[75] Inventor: Samuel Hopfer, Brooklyn, N.Y.

[73] Assignee: General Microwave Corporation, Farmingdale, N.Y.

[21] Appl. No.: 76,768

[22] Filed: Sep. 18, 1979

[51] Int. Cl.³ .............................................. H01P 1/18
[52] U.S. Cl. .................................. 333/164; 333/117; 333/156
[58] Field of Search ............................. 333/156–164, 333/245–248, 117–123; 307/320

[56] References Cited

U.S. PATENT DOCUMENTS

| | | | |
|---|---|---|---|
| 3,400,342 | 9/1968 | Putnam | 333/161 X |
| 3,423,688 | 1/1969 | Seidel | 333/117 X |
| 3,768,045 | 10/1973 | Chung | 333/164 |
| 3,996,536 | 12/1976 | Camisa et al. | 333/164 |

FOREIGN PATENT DOCUMENTS 1506156 4/1978 United Kingdom ................ 333/156

OTHER PUBLICATIONS

H. A. Watson, Microwave Semiconductor Devices & Their Circuit Applications, McGraw-Hill Book Co., New York 1969, Dispersive Phase Shifters, pp. 331–334.
R. V. Garver, 360° Varactor Linear Phase Modulator, IEEE Transactions on Microwave Theory & Techniques, vol. MIT-17, No. 3, Mar. 1969, pp. 137–147.
C. A. Liechti, et al, Controlled Wideband Differential Phase Shifters Using Varactor Diodes, IEEE Transactions on Microwave Theory & Techniques, Oct. 1967, pp. 586–589.

Primary Examiner—Marvin L. Nussbaum
Attorney, Agent, or Firm—Morton C. Jacobs

[57] ABSTRACT

This invention relates to an analog phase shifter for radio frequency signals that employs a hybrid coupler and biased varactor diodes at its reflection terminals. The diodes are operated so that the normalized reactance is unity (equals the coupler's input impedance) at an intermediate frequency which may be the geometric mean of the end frequencies of a broad bandwidth. The couplers are cascaded in tandem for a 360° phase shift. A balanced configuration of hybrid couplers is used for the phase shifter.

18 Claims, 7 Drawing Figures

SINGLE-STAGE PHASE SHIFTING CIRCUIT

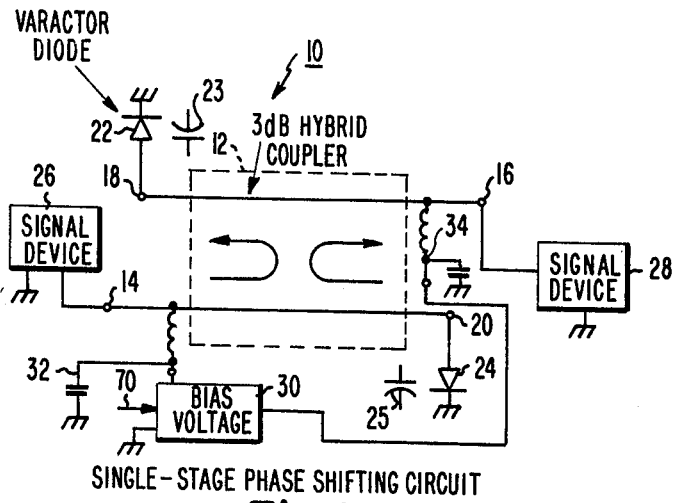
SINGLE-STAGE PHASE SHIFTING CIRCUIT
*Fig.1*
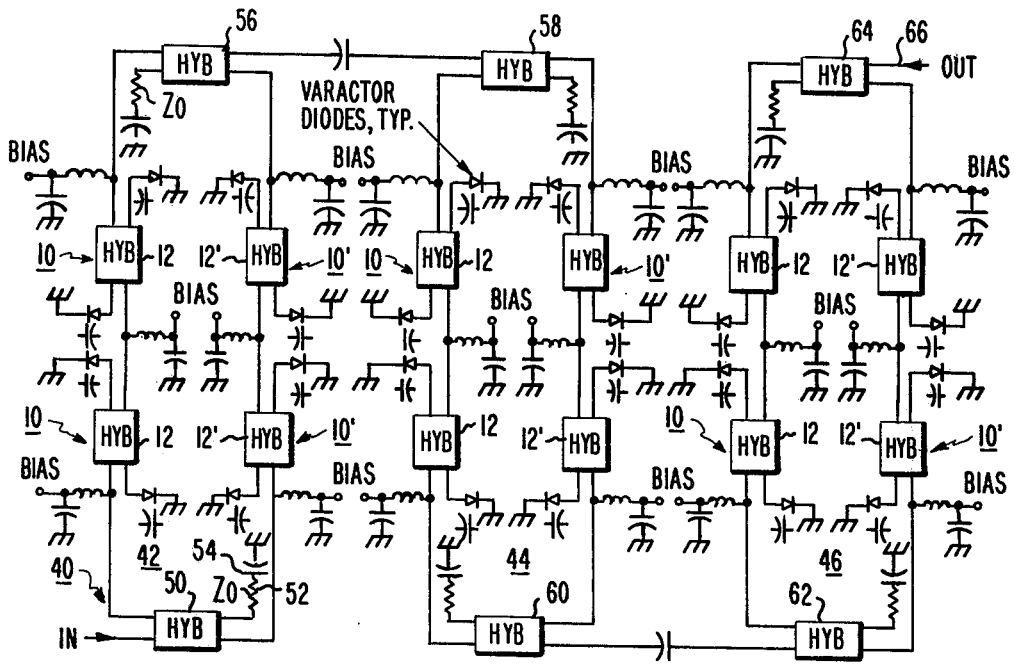
*Fig.2*
*Fig.3*
$$\begin{cases} \psi = \cos^{-1}\dfrac{X^2-1}{X^2+1},\ X=1/\omega CZ_0 & (1) \\ \text{IF } \Delta\psi' = k\Delta X/X = k\Delta C/C & (2) \\ \psi' = k\ell n X + \text{CONSTANT} & (3) \\ C_0 = 1/\omega_0 Z_0,\ \omega_0 = \sqrt{\omega 1 \omega 2} & (4) \end{cases}$$

ANALOG PHASE SHIFTER

BACKGROUND OF THE INVENTION

This invention relates to an analog phase shifter.

The analog phase shifter of this invention is an outgrowth of the demand for such devices which may be operated over a broad band of radio frequencies and which have a wide angular range of phase shift angle. Desirable characteristics of such a device are that it is capable of controlling the insertion phase over a 360° range in continuous, monotonic fashion without change in insertion loss and it should have a flat phase-shift versus frequency characteristic, over a frequency range of 2 to 1 or better and in the microwave spectrum.

SUMMARY OF THE INVENTION

It is an object of this invention to provide a new and improved analog phase shifter.

Another object is to provide a new and improved analog phase shifter which is operative over a broad band of microwave frequencies.

Another object is to provide an analog phase shifter which may be operated continuously over an angular range of 360 degrees.

In accordance with an embodiment of this invention, an analog phase shifter which is operative over a broad band of r-f frequencies particularly in the microwave bandwidth comprises a hybrid coupler having a certain input impedance corresponding to the characteristic impedance of the signal source. The coupler includes two reflection terminals, an input terminal for receiving the r-f signals from the source, and an output terminal for supplying the signals at a desired phase shift determined by the reflectance at the reflection terminals.

Separate similar variable reactors are connected to the reflection terminals to control the angle of signal reflectance at those terminals. Each variable reactor has an intermediate reactance about equal to the input impedance of the coupler at approximately the mean frequency, and includes means for varying the reactance over a limited range about the intermediate reactance. Thereby, the phase shifter operates substantially uniformly over a range of r-f frequencies to produce a range of phase shift corresponding to the range of reactances.

In accordance with one feature of an embodiment of this invention, a phase shifter is constructed in a plurality of stages, each producing a certain phase shift and the plurality cumulatively providing an overall cumulative phase shift (e.g., six stages, each having a phase shift range of 60 degrees to provide an overall phase shift of 360 degrees). In order to eliminate the individual signal ripple in each stage, which cumulatively could build up to a high level, two chains of phase shifting networks are provided, which operate on a split microwave signal. The chains are balanced and constructed to track each other so that any ripples produced in one are cancelled by the balancing effect is the other.

In one embodiment of the invention, a 360° phase shifter is constructed of three sections, with two phase shifter stages in each section. Each section uses a similar hybrid coupler as a signal operator at the input thereof, and another such hybrid coupler at the output of the section. Individual control of the bias voltages at each stage of the phase shifter produces a phase shift angle of small value, such as a fraction of a degree.

BRIEF DESCRIPTION OF THE DRAWINGS

The foregoing and other objects of this invention, the various features thereof, as well as the invention itself, will be more fully understood from the following description, when read together with the accompanying drawing, in which:

FIG. 1 is a schematic circuit and block diagram of a single-stage phase shifter embodying this invention;

FIG. 2 is a schematic circuit and block diagram of a multi-stage analog phase shifter embodying this invention and employing stages of analog phase shifters shown in FIG. 1;

FIG. 3 is a set of equations used to explain the invention of FIG. 1;

DESCRIPTION OF A PREFERRED EMBODIMENT

Figure 4:
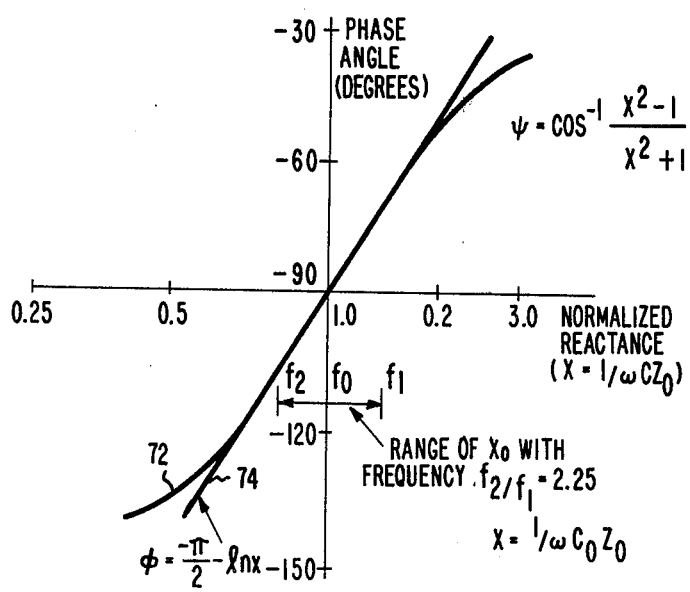
FIG. 4 is an idealized graph of the phase shift angle produced by the phase shifter of FIG. 1 as a function of the variable reactance of the reactors connected thereto.

An embodiment of the analog phase shifter 10 of this invention is shown in FIG. 1 and includes a 90° hybrid coupler 12 having two signal ports 14, 16 and two reflection ports 18, 20. Connected to the reflection ports 18 and 20 are variable reactors 22 and 24, which are connected to the common return shown by the conventional ground symbol. The variable reactors 22 and 24, in a preferred embodiment of this invention, include varactor diodes (of a high Q type) having a variable capacitance represented by the capacitor symbols 23 and 25, respectively, adjacent the diodes 22 and 24. The hybrid reflector has its ports 14 and 16 connected to signal devices 26 and 28, respectively, which includes suitable transmission lines. A bias voltage from a source 30 is supplied to the r-f signal ports 14, 16 via isolating networks 32, 34 of a series inductor and shunt capacitor, and this voltage establishes the amount of reflection at terminals 18 and 20.

The coupler 12 is a symmetrical device, so that a signal supplied at either port 14 or 16 (as the input port) is split. The incident power divides about equally between the direct and coupled arms of the coupler and is reflected at the associated reflection terminals 18 and 20. The reflected signals cancel at the input port and combine in phase at the other port acting as the output port. Thereby, the signal's phase is shifted at the output port from that of the signal supplied at the input port, in accordance with the reflection produced at the reflection terminals.

In the multi-stage phase shifter 40 of FIG. 2, a plurality of hybrid couplers 12 of the construction shown in FIG. 1 are connected in tandem to produce a cumulative phase shift. Two such couplers 12 connected in tandem in a first section 42 of shifter 40 in this particular embodiment are each designed to produced a phase shift up to 60°, and together they produce a cumulative phase shift up to 120°. Similarly, two couplers 12 in each of second and third section 44 and 46 also produce cumulative phase shifts up to 120° so that an overall cumulative phase shift of 360° is produced by the six couplers 12. The connection of these couplers in balanced sections of shifter 40 with similar couplers 12' is discussed below.

The reflection coefficient angle at the terminating varactors 22, 24 of the phase shifters 10 and 40 of FIGS. 1 and 2, respectively, is a function of the normalized reactance X of the varactors as shown in the first part of equation-1 of FIG. 3. Moreover, as shown in the second part of equation-1, the normalized reactance varies as the product of frequency and the varactor capacitance; therefore, the capacitive reactance itself also varies with frequency. By making the difference in phase proportional to the fractional change in reactance (and, thus, in capacitance) as indicated in equation-2 of FIG. 3, the variation in phase shift with frequency can be largely eliminated within the limits of suitable approximation. Such operation generally independent of frequency is achieved by approximating the operating characteristic of equation-3 in constructing the phase shifters 10 and 40; this equation, which is the integral of equation-2 at the mean frequency, closely approximates the reflection-coefficient angle in the vicinity of $X=1$, i.e., where the normalized capacitive reactance of varactors 22, 24 is equal to the input impedance of the couplers (which in turn is matched to the signal source 26 and its coupling transmission line).

The linear graph for the particular form of phase-shift characteristic of equation-3 (which is approximately achieved in phase shifter 10 or 40) is shown on a semilog scale in FIG. 4; this equation 3 closely approximates, in the vicinity of $X=1$, the actual equation-1 for the phase shifter's reflection-coefficient angle (the graph of which is also shown in FIG. 4 for comparison). That is, the relationships of equation-4 hold approximately for the phase shifter 10 or 40 where, for an intermediate frequency corresponding to the geometric mean of the end frequencies of the operating bandwidth, the varactor capacitance Co is so chosen that the normalized reactance of the varactors 22, 24 is unity. This parameter of the varactors' reactance being equal to the input impedance of the coupler (e.g., that of a 50 ohm transmission line) tends to minimize the deviation of the phase shift (of shifter 10 or 40) from a constant value, so that operation largely independent of frequency is achieved. Thereby, the phase-shift versus frequency characteristic can be made quite flat over a broad frequency range.

For a particular embodiment designed to operate over a frequency range of 8 to 18 GHz, the capacitive reactance changes from a value of 1.5 at $f_1$ to a value of 0.67 at $f_2$. For a 60° phase shift per stage at the intermediate, mean frequency $f_o$ (12 GHz), the required capacitance ratio is approximately 3:1. This can lead to a phase compression at the ends of approximately 7° in 60° or 12%. To ensure the full 60° range for shifter 10, the capacitance ratio is chosen to be about 4:1 or higher.

It should also be noted that the maximum change in angle for a given fractional change in normalized reactance X occurs when X equals unity (as distinct from the maximum angle change with absolute change in X, which is when X is 0, the short circuit point). This effect also maximizes the phase shift obtainable for a given capacitance ratio of the varactor.

The six tandem shifters 10 in shifter 40 of FIG. 2 are each constructed to operate in the linear region of the characteristic of FIG. 4 about $X=1$ as discussed above. Thereby, each shifter 10 operates in the manner described above so that its operating characteristic of the differences between phase shifts is approximately the logarithm of the ratio of reactances (or of capacitances), and therefore the differences in phase shifts are generally independent of frequency. Thus, the overall phase-shift differences of shifter 40 are similarly independent of frequency over the cumulative angle.

The input 48 of the shifter 40 is connected to another hybrid coupler 50 which is similar to hybrid 12 construction and is used as an input power-splitter for section 42. The output port of coupler 50 is terminated in a resistor 52 of characteristic impedance and connected to ground via capacitor 52 to decouple the direct bias voltage from ground. Another hybrid coupler 56 is similarly constructed and operates as a signal combiner for section 42.

Splitter 50 supplies the power-split signals to the tandem chain of two couplers 12, and to a similar chain of two shifters 12' also constructed like shifter 10 of FIG. 1. The outputs of these tandem chains are supplied as inputs to combiner 56. These two chains of shifters 10 and 10' closely track each other so that any ripple that occurs in the chains is cancelled in the combiner 56.

Figure 6:
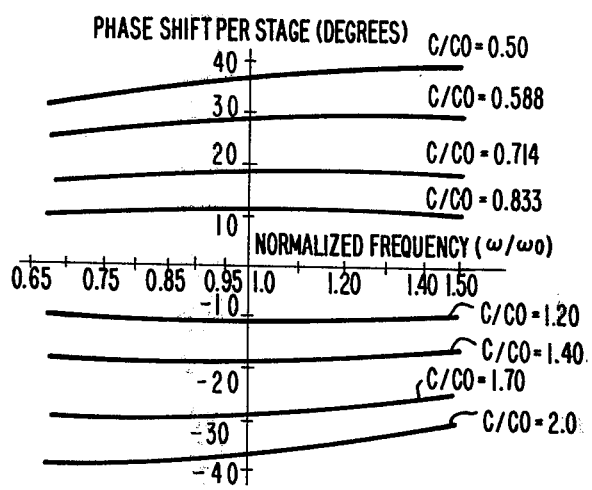
FIG. 6 is a graph of the phase shift produced by the phase shifter of FIG. 1 as a function of normalized frequency and for different ratios of capacitance.
Figure 7:
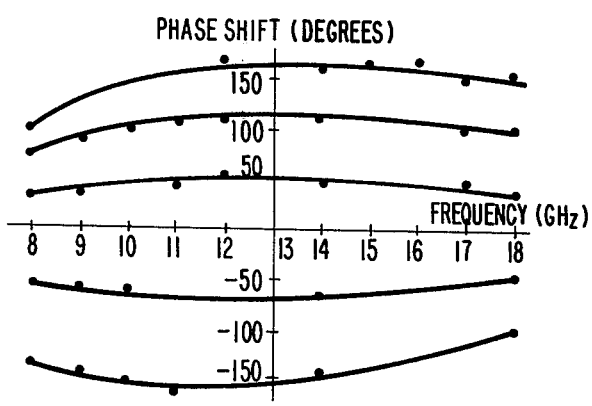
FIG. 7 is an idealized graph of the operation of the phase shifter of FIG. 1, with the phase shift in degrees as presented as a function of frequency over a broad bandwidth.

Similarly, power splitters 58 and 62 operate to supply the two chains of tandem shifters 10 and 10' in sections 44 and 46, respectively, and combiners 60 and 64 operate for each section to cancel the ripples in the two tracks of shifters. Thus, any ripple due to interstage reflections that tend to occur in each section is kept to a tolerable VSWR, and it is eliminated by combining in each section. This balanced arrangement keeps the shifter 40 well matched for opertion over 360° and makes it possible to maintain overall reciprocal operation of the shifter 40 based on the reciprocal construction of the individual shifters 10 and 10'. Various numbers of shifters 10 and 10' may be connected in tandem for each section, and various numbers of sections may be used; the illustrative arrangement of FIG. 2 was found suitable for that embodiment. FIG. 7 illustrates the experimental data obtained for operation of the shifter 40 over a bandwidth of 8 to 18 GHz and illustrates the constancy of phase shift with frequency over the entire bandwidth and for a full 360° phase shift. FIG. 6 illustrates the theoretical phase shift for each stage of shifter 10 or 10' plotted against normalized frequency, and with different curves for the normalized capacitance ratios.

Figure 5:
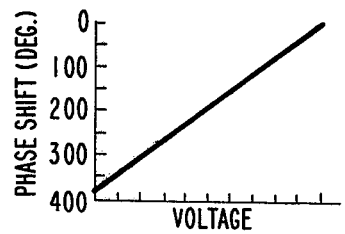
FIG. 5 is a graph of the phase shift angle versus control voltage of the multi-stage phase shifter of FIG. 2.

The bias voltage from source 30 is supplied to the signal ports 14, 16 merely for convenience; the bias could be supplied directly to the varactors 22, 24 at the reflection terminals 18, 20. The bias voltage is chosen in accordance with conventional varactor law. That is, the bias voltage is a negative d-c voltage; the more negative, the less the capacitance and the greater the reactance. A control voltage on line 70 is the ultimate source of phase shift control, and this control voltage has a linear and one-to-one correspondence with the desired phase shift over the 360° range (e.g., in the case of shifter 40). The bias source 30 includes a suitable transfer network to convert the linear control voltage to the required varactor bias needed to produce the desired phase shift. FIG. 5 is a graph of the essentially linear relation between phase shift and control voltage for operating the shifter 40.

The same bias voltage is supplied to all varactors in the shifter 40 so that each shifter stage 10, 10' produces the same phase shift. This invention may also be used in a shifter whose stages have different phase shifts. Each shifter stage 10, 10' may be designed for any desired range of angle. Generally, the smaller the phase shift angle chosen for a stage, the more closely does the actual shifter characteristic 72 (FIG. 4) of that stage approximate the logarithmic characteristic 74, and the flatter the phase-shift versue frequency characteristic over a broad bandwidth (and the smaller the capacitance ratio that may be used) as shown by the curves of FIG. 6. When using a smaller angle per shifter stage a larger number of shifter stages may be connected in tandem to obtain any desired overall phase shift.

The balanced configuration of the phase shifter 40 of FIG. 2 is preferred for a multi-stage shifter. However, the shifter stages 10 of FIG. 1 may also be connected in tandem without using a balanced arrangement. Generally, as described above, the shifter stage is constructed for optimum characteristics with the normalized reactance equal to the input impedance of the coupler at approximately the mid-band (geometric mean) frequency. However, advantageous operation of the shifter stage may be obtained where the unity value of the normalized reactance occurs at some other intermediate frequency of the desired bandwidth.

This invention is also described in the applicant's technical paper "Analog Phase Shifter for 8-18 GHz" published in the Microwave Journal of March, 1979, which is incorporated here by reference. Microstrip hybrid couplers with GaAs unpackaged varactor diode chips were used in an actual form of this invention as described in applicant's 1979 paper. A specific form of microstrip hybrid coupler that can be used in construction of this invention is also described in applicant's concurrently filed patent application, Ser. No. 076,767. Other variable reactance devices may be used such as inductors; preferably, they should be reciprocal devices. The constructions of phase shifters with hybrid couplers (or circulators) and varactor diodes are described in the following: "Microwave Semiconductor Devices and Their Circuit Applications," H. A. Watson, Ed., McGraw-Hill, 1969, pp. 331-334; "360° Varactor Linear Phase Modulator" by R. V. Garver, IEEE Tr. Microwave Theory and Techniques, Vol. MTT-17, March 1969, pp. 137-147; "Controlled Wideband Differential Phase Shifters Using Varactor Diodes" by C. A. Liechti, et al, IEEE Tr. Microwave Theory and Techniques, October 1967, pp. 586-589. These publications are incorporated by reference. Other modifications of this invention will be apparent to those skilled in the art from the above-described embodiments of this invention.

Thus, a new and improved phase shifter is provided by this invention. The phase shifter is operative over a broad band of radio frequencies continuously and monotonically over an angular range of 360° and generally independent of frequency.

What is claimed is:

1. An analog phase shifter for electrical signals at microwave radio frequencies within a certain broad bandwidth, said phase shifter comprising:
    a hybrid coupler having a certain input impedance and including two reflection terminals, and two signal terminals respectively for receiving radio frequency signals from a source and for supplying said signals at a desired phase shift;
    and separate similar means for producing a variable reactance connected to said reflection terminals to control the angle of signal reflectance thereat and thereby said phase shift, said variable reactance means, each producing an intermediate reactance approximately equal in magnitude to the input impedance of said coupler at an intermediate frequency of said bandwidth, and including means for varying said reactance over a certain range about said intermediate reactance in response to a control signal;
    whereby said phase shifter is substantially independent of frequency over said bandwidth of radio frequencies.

2. An analog phase shifter as recited in claim 1 wherein said intermediate frequency is the mean frequency.

3. An analog phase shifter as recited in claim 2 wherein said variable reactance means includes varactor diodes terminating said reflection terminals.

4. An analog phase shifter for electrical signals at radio frequencies within a certain bandwidth comprising:
    a first and a second plurality of similar variable phase shifter devices connected in tandem with the output terminal of one phase shifter device connected to the input terminal of another, each of said phase shifter devices including a similar 90° hybrid coupler having an input and an output terminal and two reflection terminals, and a separate variable reactor terminating each of said reflection terminals including means for varying the reactance of said reactor in response to a control signal;
    a power splitter including a similar 90° hybrid coupler for supplying said signals in balanced symmetrical relation to the input signal terminals of one of said phase shifter devices of each of said two pluralities of shifter devices;
    and a combiner including a similar 90° hybrid coupler for recombining the phase-shifted signals in balanced symmetrical relation from the output signal terminal of another of said phase shifter devices of each of said two pluralities of shifter devices;
    said phase shifter devices, power splitter and combiner being connected in reciprocal relation;
    whereby spurious reflections tend to be cancelled by the balanced symmetrical relation.

5. An analog phase shifter including a plurality of analog phase shifters as recited in claim 4, the output of the combiner of one of said phase shifters being connected to the input of the power splitter of another of said phase shifters.

6. An analog phase shifter as set forth in claim 5 wherein said means for varying the reactance being operable to produce a phase shift of 360° of said reactors includes means for applying the same bias signal to each of said variable reactors in response to a single control signal to produce the same phase shift in each phase shifter.

7. An analog phase shifter including a plurality of analog phase shifters as recited in claim 4, the output of the combiner of the first one of said phase shifters being connected to the input of the power splitter of a second one thereof, and the output of the combiner of said second phase shifter being connected to the input of the power splitter of a third one; the separate variable reactor of each of said phase shifters being operable to produce a phase shift of 60°, and said three phase shifters being operable to produce a phase shift of 360°.

8. An analog phase shifter as recited in claim 4, and further comprising means, including said variable reactors and reactance varying means, for varying the phase shift as a logarithmic relation of the reactance, the frequency dependent portion of the reactance of said variable reactor being factorable, whereby said phase shifter operates substantially independently of frequency over said bandwidth.

9. An analog phase shifter for electrical signals at microwave radio frequencies within a certain broad bandwidth, said phase shifter comprising:

a multiterminal passive device having a certain characteristic impedance, and including an input terminal for receiving microwave radio frequency signals, a reflection terminal, and an output terminal for supplying said signals at a desired phase shift determined by the reflectance at said reflection terminal;

and means, including a variable reactance network connected to said reflection terminal to control the angle of said reflectance, for varying the phase angle of the output signals approximately as a logarithmic relation of the reactance of said network over said bandwidth, the frequency dependent portion of the reactance of said network being factorable;

whereby said phase shifter operates substantially independently of frequency over said bandwidth of radio frequencies.

10. An analog phase shifter as recited in claim 9 wherein said phase angle varying means further includes means for varying the reactance of said reactance network about an intermediate value of reactance approximately equal in magnitude to the characteristic impedance of said passive device at an intermediate frequency between the two end frequencies of said bandwidth.

11. An analog phase shifter as recited in claim 10 wherein said intermediate frequency is the mean frequency of said bandwidth.

12. An analog phase shifter as recited in claim 9 wherein the reactance of said network is representable by a single lumped reactive element.

13. An analog phase shifter as recited in claim 12 wherein said variable reactance networks are variable capacitors.

14. An analog phase shifter as recited in claim 13 wherein said variable capacitors are gallium arsenide chips.

15. An analog phase shifter as recited in claim 9 wherein said passive device is a 90° hybrid coupler.

16. An analog phase shifter as recited in claim 15 wherein said phase shifter comprises a plurality of hybrid couplers each similar to said hybrid coupler and having a plurality of said variable reactors connected thereto; said hybrid couplers being connected in tandem with the output of one connected to the input of the next, so that the overall phase shift is cumulative of the individual phase shifts.

17. An analog phase shifter as recited in claim 16 wherein said reactance varying means includes means responsive to said control signal for supplying a bias voltage to said varactor diodes of said hybrid couplers to produce a phase shift varying linearly with said control signal.

18. An analog phase shifter comprising a plurality of analog phase shifters as recited in claim 9, the output terminal of one of said phase shifters being connected to the input of another of said phase shifters.

* * * * *